United States Patent [19]

Chu

[11] 3,961,997
[45] June 8, 1976

[54] FABRICATION OF POLYCRYSTALLINE SOLAR CELLS ON LOW-COST SUBSTRATES

[75] Inventor: Ting L. Chu, Dallas, Tex.

[73] Assignee: The United States of America as represented by the Administrator of the National Aeronautics and Space Administration, Washington, D.C.

[22] Filed: May 12, 1975

[21] Appl. No.: 576,488

[52] U.S. Cl. .................................. 148/174; 29/572; 136/89; 148/175; 156/612; 156/613; 156/614; 357/30; 357/59; 427/86; 427/113; 427/248; 427/249; 427/250
[51] Int. Cl.² .................. H01L 31/00; H01L 27/14; H01L 29/04
[58] Field of Search ............. 148/174, 175; 136/89; 357/30, 59; 156/612–614; 427/86, 113, 248–250; 29/572

[56] References Cited
UNITED STATES PATENTS

| | | | |
|---|---|---|---|
| 2,537,255 | 1/1951 | Brattain | 136/89 |
| 2,763,581 | 9/1956 | Freedman | 148/175 |
| 2,840,489 | 6/1958 | Kempter et al. | 427/248 |
| 2,880,117 | 3/1959 | Hanlet | 148/174 X |
| 3,011,877 | 12/1961 | Schweickert et al. | 148/175 X |
| 3,078,328 | 2/1963 | Jones | 136/89 |
| 3,411,050 | 11/1968 | Middleton et al. | 136/89 X |
| 3,433,677 | 3/1969 | Robinson | 136/89 |
| 3,460,240 | 8/1969 | Tarneja et al. | 29/572 |
| 3,586,541 | 6/1971 | Chamberlin | 136/89 X |
| 3,914,856 | 10/1975 | Fang | 29/572 |

Primary Examiner—L. Dewayne Rutledge
Assistant Examiner—W. G. Saba
Attorney, Agent, or Firm—Ronald F. Sandler; Robert D. Marchant; John R. Manning

[57] ABSTRACT

Low-cost polycrystalline silicon cells supported on substrates are prepared by depositing successive layers of polycrystalline silicon containing appropriate dopants over supporting substrates of a member selected from the group consisting of metallurgical-grade polycrystalline silicon, graphite and steel coated with a diffusion barrier of silica, borosilicate, phosphosilicate, or mixtures thereof such that p-n junction devices are formed which effectively convert solar energy to electrical energy.

5 Claims, 16 Drawing Figures

FABRICATION OF POLYCRYSTALLINE SOLAR CELLS ON LOW-COST SUBSTRATES

ORIGIN OF INVENTION

The invention described herein was made in the performance of work under a grant from the National Science Foundation and assigned to the United States Government and is available for licensing from the National Aeronautics and Space Administration.

BACKGROUND OF THE INVENTION

Field of the Invention

The present invention relates to a method of producing p-n junction semiconductor solar cells. More particularly, the invention relates to a method of producing solar cells with the principal objective of sharply reducing production costs by depositing polycrystalline silicon on a relatively cheap substrate such as metallurgical-grade silicon, graphite or steel.

Description of the Prior Art

The problem of uncovering new, abundant, cheap and non-polluting sources of energy is a problem of vital national importance. Of all energy sources, solar energy is one of the more attractive sources because of its abundant supply and because it is completely non-polluting. An indication of the abundance of solar energy is evident by the fact that the solar power on the surface of the earth is approximately one hundred thousand times greater than the current power consumption from all energy sources.

Presently, solar energy is utilized by converting solar energy to thermal energy and by converting solar energy to electricity which is known as the photovoltaic system. Both methods of utilizing solar energy are expected to aid in meeting the ever-increasing demand for clean solar energy. Currently, the silicon solar cell is the most well-known device in the photovoltaic system. Further, technology has advanced to the point where silicon solar cell panels which are capable of producing several kilowatts of power have been used reliably in all types of space craft for many years.

Currently, silicon solar cells are manufactured by preparing polycrystalline silicon by reducing trichlorosilane with hydrogen, growing single crystals of silicon of controlled purity from the polycrystalline material, preparing silicon wafers by cutting the single crystal ingot to a thickness of at least 0.25 mm followed by polishing and etching, diffusing a dopant into the silicon wafers to form a shallow p-n junction, applying ohmic contacts to the rear surface and grid contact to the diffused surface, applying antireflecting and protective coatings to the diffused surface and finally mounting the cell into position. This rather intricate procedure results in the current high costs of manufacturing silicon solar cells. Although the costs of production for single crystalline solar cells has recently been reduced from about $100/peak watt to about $20/peak watt, further reduction in cost of about one order of magnitude is necessary if widespread utility of solar cells is to be realized in large-scale terrestrial applications.

One prior art process of manufacturing semiconductor solar cells as shown by Tarneja, et al., U.S. Pat. No. 3,460,240, involves epitaxially depositing silicon on a quartz substrate to form an N-type layer over which is epitaxially deposited two P-type silicon layers. However, this process has the disadvantage that the overall process requires the rather detailed and expensive sequence of steps necessary to deposit epitaxial silicon so that no significant decrease in cost of manufacture is observed.

The Jones reference, U.S. Pat. No. 3,078,328, shows a method of manufacturing solar cells in which a layer of silicon is grown onto a graphite surface from a silicon melt and doped to form an N-type layer. In the growth step, silicon and carbon at the interface of the silicon and graphite layers mix to form an intermediate layer of silicon carbide. The device is completed by formation of a top p-type layer of silicon by diffusion. The reference again is disadvantaged by the complicated fabrication procedure. Thus, the cost of manufacture is unattractive from a commercial viewpoint.

Small-area polycrystalline silicon solar cells have also been fabricated by the deposition of silicon from a vapor state reactant. A polycrystalline silicon layer of a thickness of 25 – 50 $\mu$m was deposited on silicon substrates at 900°C by the reduction of trichlorosilane with hydrogen. In this method, silicon substrates were used for convenience in order to eliminate the cracking of silicon which has been deposited on other substrates. By this procedure, 1 cm$^2$ solar cells were fabricated by the successive diffusion of gallium and phosphorous to form a p-n junction about 2.5 $\mu$m below the surface of the device. The device had a maximum open-circuit voltage of about 0.3 V, and the greatest efficiency was about 0.9%.

A need continues to exist, therefore, for a method by which silicon semiconductor solar cells can be easily and cheaply produced.

SUMMARY OF THE INVENTION

Accordingly, one object of the present invention is to provide a method of manufacturing polycrystalline silicon semiconductor solar cells readily and cheaply.

Another object of the invention is to provide a method of bonding polycrystalline silicon to common substrates of substantially different chemical composition so as to form silicon semiconductor solar cells.

Briefly, these objects and other objects of the invention, as hereinafter will become more readily apparent, can be attained in a method of fabricating lowcost polycrystalline silicon solar cells by depositing successive layers of polycrystalline silicon containing appropriate dopants over supporting substrates of a member selected from the group consisting of metallurgical-grade polycrystalline silicon, graphite and steel coated with a diffusion barrier of silica, borosilicate, phosphosilicate or mixtures thereof such that p-n junction devices are formed which effectively convert solar energy to electrical energy. When graphite is used as the substrate, a diffusion barrier of silicon carbide is formed between the graphite substrate and the first overlying polycrystalline silicon layer. When steel is the supporting substrate, a diffusion barrier of silica, borosilicate, phosphosilicate or mixtures thereof must be deposited prior to deposition of the first polycrystalline layer in order to avoid diffusion of contaminating iron atoms into the deposited silicon layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

An important consideration in the manufacture of silicon semiconductor solar cells is the type of support structure employed. The ideal support should be one which has the characteristics of being low in cost, lightweight, chemically inert to silicon at high temperatures, having a high electrical conductivity and a coefficient of expansion similar to that of silicon. Furthermore, the substrate should be such that silicon strongly adheres to the surface of the substrate, and the interface between the substrate and the silicon layer should be of low electrical resistance. In the past, refractory metals such as tantalum have been used as substrates for the deposition of polycrystalline silicon of high purity. Such substrates, however, have not been satisfactory because, from an economical point of view, they are not competitive. The choice of an appropriate substrate having the above-mentioned advantages would be a significant factor in lowering the costs of silicon solar cells, thus rendering their use more attractive.

The high cost of manufacturing silicon solar cells from semiconductor grade silicon has already been discussed. High costs are involved by the series of process steps involved and the high cost of some of the manufacturing steps in particular. In view of these problems, the use of a thin layer of polycrystalline silicon containing a p-n junction deposited on a suitable substrate should substantially reduce material and process costs. Although the efficiency of polycrystalline silicon solar cells cannot compete with the efficiency of single crystalline cells, the unit power costs would be many times less than that of present single crystal cells.

Figure 1:
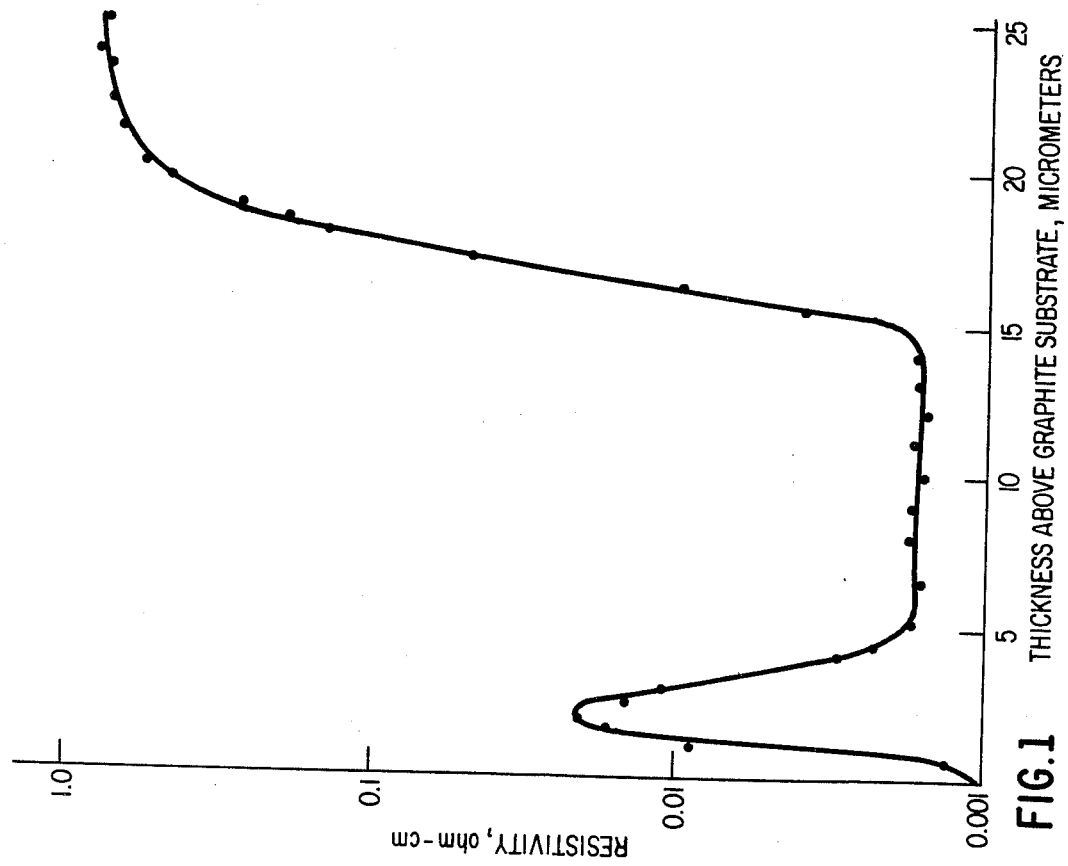
FIG. 1 shows the resistivity profile of the p-region of polycrystalline silicon solar cell device supported on a graphite substrate.

It has now been discovered that polycrystalline silicon can be satisfactorily deposited on a steel, graphite or metallurgical polycrystalline silicon substrate to form a suitable silicon solar cell. The p-n junction must be very shallow; the n-layer (or the upper layer) is 0.2 – 0.4 $\mu$m in thickness, and the p-layer (or the inner layer) is 10 – 100 $\mu$m in thickness. The order of preference of substrates is: metallurgical-grade silicon, graphite, and steel. Although most steels will serve the purpose, metallurgical grade silicon and graphite are preferred. In the preparation of solar cells using either a graphite or polycrystalline silicon substrate, polycrystalline silicon is deposited on an appropriate substrate by any acceptable procedure normally used for the deposition of polycrystalline silicon, such as by the thermal decomposition of silane, by the reduction of trichlorosilane or silicon tetrachloride with hydrogen at temperatures ranging from 900°C – 1200°C or by the thermal decomposition of dichlorosilane. Several such layers are deposited and appropriately doped so as to form a p-n junction device by any conventional procedure known to one skilled in the art. In one embodiment, the first deposited silicon layer is doped with a p +-type dopant to achieve a p +-type layer 10 – 30 $\mu$m thick and having a resistance of 0.007–0.003 ohm-cm. Doping occurs simultaneously with the deposition of silicon by introducing the dopant gas, e.g., diborane for p-type conductive layers and phosphine for n-type conductive layers, in proper amount into the reactant mixture. Thereafter, two successive silicon layers are deposited which are p-type and then n-type successively. The p-type layer is 8 – 10 $\mu$m thick and has a resistance of 0.2 – 2 ohm-cm, while the n-type layer is 0.2 – 0.4 $\mu$m thick and has a resistance of 0.001 – 0.002 ohm-cm. FIG. 1 shows the resistivity profile of the structured device, except for the n-layer, which is obtained by the spreading resistance technique. The plot shows a high resistivity area in the silicon adjacent the graphite-silicon interface and is apparently caused by the formation of silicon carbide.

Figure 2:
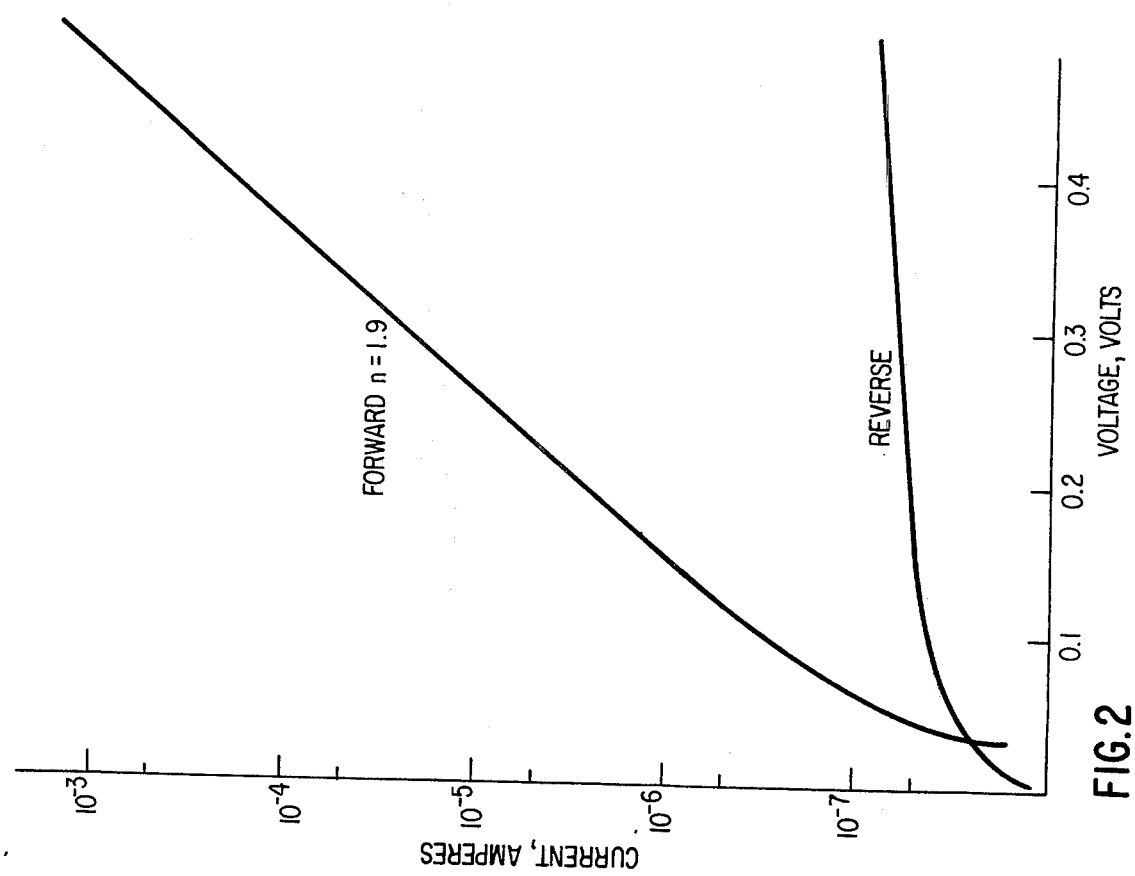
FIG. 2 shows the current-voltage characteristics of a mesa diode formed from a polycrystalline silicon, p-n junction device supported on a graphite substrate.

In one embodiment of the invention, the silicon devices above can be converted into mesa diodes by depositing titanium-silver or gold dots on the silicon surface followed by masking and etching of the surface. Titanium-silver is the preferred contact material. FIG. 2 shows the current-voltage characteristics of one of these diodes which is exemplary of the values obtained for these diodes, wherein the $n$ value calculated from the forward characteristics is 1.9, which is very similar to that for single crystal silicon p-n junctions. This value indicates that the grain boundaries in polycrystalline silicon deposited on graphite supports are not significant in current conduction.

By the procedure shown above, solar cells can be fabricated wherein the thickness of the polycrystalline silicon layer of the cell ranges from 0.001 to 0.005 cm which is at least 100 times less than the amount of silicon employed in single crystal solar cells. The most significant advantages is that the energy-, labor-, and material-consuming steps of the process of producing single crystal cells, i.e., the growth of single crystals step, the preparation of the silicon wafers and the diffusion process, are eliminated. Although the efficiency of the polycrystalline solar cells is less than that of single crystal cells, the disadvantage is more than countered by the many times lower unit power costs of the polycrystalline cells.

A similar procedure to that shown above can be used to prepare polycrystalline silicon solar cells having a support structure of metallurgical polycrystalline silicon by any method known to those skilled in the art of establishing p-n junctions in deposited polycrystalline silicon. In a representative procedure, a p-type polycrystalline layer is deposited on a wafer of silicon, which has been pretreated with hydrogen or with hydrogen chloride at an elevated temperature ranging from 1000°C to 1100°C by the decomposition of silane with diborane as the dopant source. Thereafter, an upper n-type silicon layer is deposited using phosphine or arsine as a dopant to yield a structure having a shallow p-n junction. The device is completed by attaching leads to the n- and p-regions.

In another aspect of the invention, the fabrication of the cheap silicon solar cells by the decomposition of polycrystalline silicon on a steel substrate was attempted. The problem of using steel as a substrate for polycrystalline silicon cells is complicated by several problems. The first is that a large and therefore significant difference exists in the thermal expansion coefficients of the materials. Silicon has an expansion coefficient of $4 \times 10^{-6}°C^{-1}$, while most steels have coefficients of $14 - 16 \times 10^{-6}°C^{-1}$. Another factor is that high rates of diffusion of silicon and iron atoms occur into each other between adjacent layers of steel and polycrystalline silicon at the temperatures employed in the deposition process. It is known from the phase diagrams of mixtures of iron and silicon that the following iron silicides form: $Fe_3Si$, $Fe_5Si_3$, $FeSi$ and $FeSi_2$. Still another factor is that at temperatures above 800°C, a solid solution of iron silicides forms when silicon is deposited on steel substrates by any of the conventional silicon deposition procedures. This latter fact is substantiated by the high electrical conductivity of the region.

In view of the above problems with steel as a substrate for silicon solar cells, it is apparent that another material must be applied between the deposited silicon layer and the steel substrate. Any such material (hereinafter referred to as the "diffusion barrier") must have the ability to minimize the difference in thermal expansion characteristics of the two layers and should be chemically inert to steel and silicon at high temperatures. Further, the intervening layer should strongly adhere to both the steel and polycrystalline layers and be compatible with the manufacturing technology of the polycrystalline silicon. Thus, for example, the diffusion barrier may be deposited by in-situ chemical vapor deposition prior to application of the silicon layer.

It has now been found that layers of films of silica, borosilicate, phosphosilicate, aluminosilicate and combinations thereof form suitable diffusion barriers between steel and silicon. If the diffusion of boron is objectionable from a borosilicate layer to the silicon layer, a borosilicate-silica double layer is necessary between the steel and silicon layers.

Silica, borosilicate and phosphosilicate are all inert toward silicon and steel at high temperatures, and have the added advantage of being relatively soft. For instance, silica and silicon have hardness values on the Moh's scale of 5 and 7, respectively. The thermal expansion coefficient of borosilicate can be changed as a function of its composition which makes its use particularly attractive. For example, a borosilicate composition containing 18 mole % boron oxide has a thermal expansion coefficient similar to that of silicon.

In polycrystalline silicon devices which have a borosilicate/steel base, borosilicate is amorphous and is not expected to significantly influence the structure of the silicon deposit. Silicon which is deposited over borosilicate has properties similar to silicon which is deposited over silicon nitride or silicon dioxide. Various factors such as substrate temperature, deposition rate and the amount of boron incorporated substantially influence the microstructure of the overlying silicon layer. Generally, silicon which is deposited at low temperatures and high rates without intentional doping consists of small crystallites, the size of which increases with increasing deposition temperature, decreasing decomposition rate and the incorporation of high concentration of boron, for example, a concentration of about $10^{20}$ boron atoms/cm$^3$. Undoped silicon film deposited at 900°C at a rate of 2 $\mu$m/min reveals a fiber-like structure. However, as the deposition rate is decreased to 0.2 $\mu$m/min, small crystallites of silicon less than 1 $\mu$m in size become dominant. Further, a notable increase in the size of the crystallites occurs by further increasing the deposition temperature to 1000°C.

Both silica and borosilicate can be readily deposited on steel substrates by a variety of known chemical deposition techniques of which the following are exemplary: Silica can be deposited by (1) the oxidation of silane, or (2) by the pyrolysis of a tetraalkoxysilane, such as tetraethoxysilane. Borosilicate can be deposited (1) by the oxidation of a mixture of silane and diborane, or (2) by the pyrolysis of a tetraalkoxysilane-trialkoxyborane mixture such as tetraethoxysilane-trimethoxyborane. Naturally, the amounts of boron and silicon in the borosilicate are determined by the mole ratios of the silicon reactant and the boron reactant. Other suitable alkoxyboranes include triethoxyborane and tripropoxyborane, and other suitable tetraalkoxysilanes include tetramethoxysilane and tetrapropoxysilane. The methods by which the silica and borosilicate diffusion barriers are deposited on the steel substrates are not critical, and any deposition method well known to those skilled in the art is applicable. Phosphosilicate layers can be deposited by any suitable technique such as by the oxidation of silane and phosphine mixtures or by the hydrolysis of a silicon tetrachloride-phosphorous trichloride mixture. All of the above methods for depositing the above diffusion layers are compatible with current methods of depositing polycrystalline layers. Normally, the thickness of the deposited diffusion barrier is 1 - 5 $\mu$m. Normally, the borosilicate diffusion layers contain from 10 - 18% boron while phosphosilicate layers contain from 10 - 20% phosphorous.

By using the above diffusion barrier materials it is possible to prepare integral and tightly formed structures such as silicon/silica/steel, silicon/borosilicate/steel and silicon/silica-borosilicate/steel which completely avoid contamination by highly conductive iron silicide. Suitable steels used for the substrates of the present solar cells include Armco silicon steel and USS Vitrenamel I, which has a carbon content less than 0.008%. Prior to deposition of the first polycrystalline silicon layer to eventually form the necessary p-n junction, the surface of the steel can be scavenged of oxygen by treatment with a reducing agent such as hydrogen at a temperature from 600° to 1000°C, preferably 900° to 1000°C. Thereafter, the appropriate silica, borosilicate or phosphosilicate layer can be deposited on the steel surface.

Having generally described the invention, a further understanding can be obtained by reference to certain specific examples which are provided herein for purpose of illustration only and are not intended to be limiting unless otherwise specified.

EXAMPLE 1

Figure 3A:
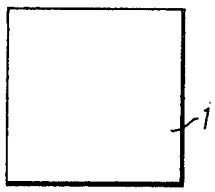
FIGS. 3 A-F show one embodiment of polycrystalline silicon, p-n junction devices supported on a graphite substrate.
Figure 3C:
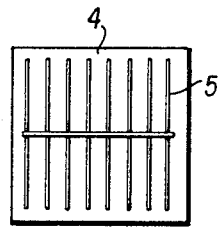
Figure 3E:
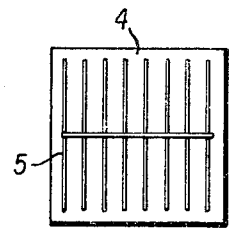
Figure 3B:
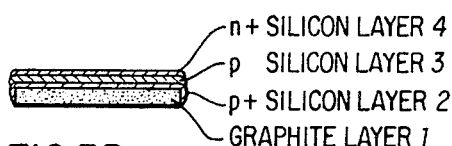
Figure 3D:
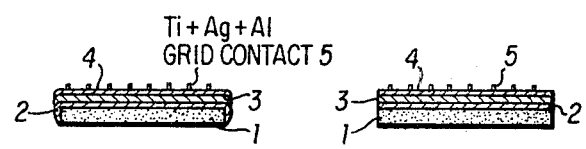
Figure 3F:
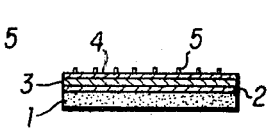

FIG. 3A shows a graphite base and FIG. 3B shows the structural configuration of a solar cell having a graphite base 1, over which was deposited a p+–silicon layer 2 by the thermal decomposition of silane and diborane. Thereafter, p-silicon layer 3 and n+–silicon layer 4 were deposited by the thermal decomposition of silane using diborane and silane as dopants, respectively. Grid contacts of Ti-Ag-Al 5 were evaporated onto the n+–silicon surface as shown in FIGS. 3C and 3D. FIGS.

3E and 3F show another view of the device in which excess silicon deposits were removed from the periphery of the device. The current-voltage characteristics of the device were measured with an Aerospace Control Corp. Model 302+AMO solar simulator at room temperature, and the efficiencies achieved for a series of cells were in the range of 1.0 – 1.6%.

Figure 4:
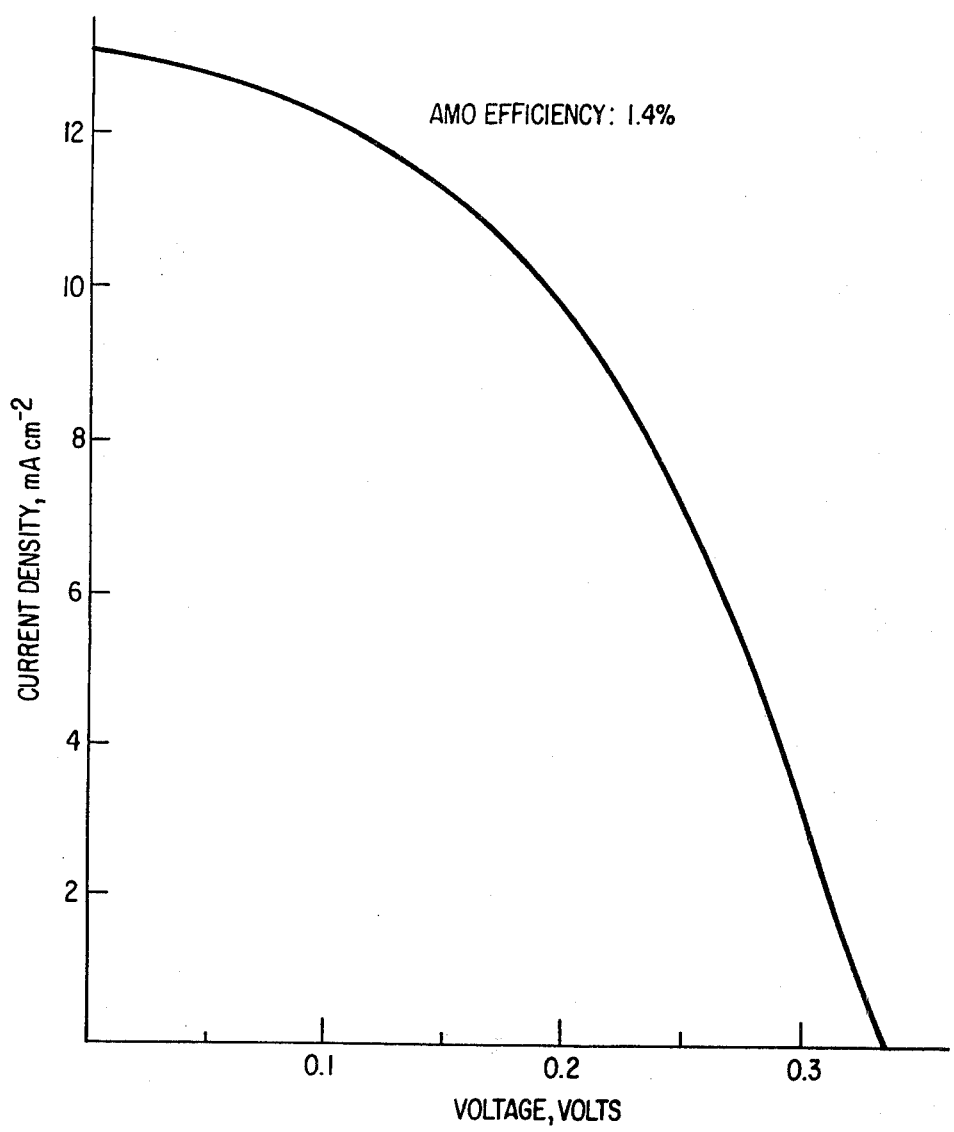
FIG. 4 is a graph of the current-voltage characteristics of one of the devices of FIG. 3.

FIG. 4 is a plot of current density versus voltage for one of the above polycrystalline silicon on graphite solar cells. The open-circuit voltage, short-circuit current density, and fill factor obtained are 0.33 V, 13 mA/cm$^2$, and 0.44, respectively. A value of 0.85 ohms was obtained for its series resistance from the current-voltage relations under several different levels of illumination.

EXAMPLE 2

A 6cm$^2$ disc of p-type polycrystalline silicon having a resistivity of 0.001 ohm-cm was obtained from metallurgical grade silicon. The disc was heated under a hydrogen atomosphere at 1000°C. A p-type, 10 $\mu$m thick layer of polycrystalline silicon was deposited by thermally decomposing silane with diborane as the dopant to produce a resistivity of 1 ohm-cm. Thereafter, an n-type layer 0.2 – 0.4 $\mu$m thick and having a resistivity of 0.002 ohm-cm was deposited by thermally decomposing silane and phosphine to yield a shallow p-n junction device. Aluminum contacts were attached to the p- and n- regions. The device was subjected to light from an AMO solar simulator and an open circuit voltage and short-circuit current density of 0.52 V and 15 mA/cm$^2$, respectively, were obtained, corresponding to a conversion efficiency of 3%.

Deposition of Borosilicate on Steel Substrates:

0.6 – 1.5 mm thick low carbon U.S. Steel Vitrenamel steel plates having a linear thermal expansion coefficient of 1.4 × 10$^{-5}$°C in the temperature range of 25° –700°C were used as substrates (Note that silicon has an expansion coefficient of 3.6 × 10$^{-6}$°C$^{-1}$.). The steel substrates were placed in and supported on a silicon carbide coated graphite susceptor and the susceptor was heated exothermally by an rf generator. Before silicon was deposited on the wafers, the steel substrates were heated under a hydrogen atmosphere at 1000°C to remove oxygen from the steel surface. A film of borosilicate of a thickness ranging from 3 – 5 $\mu$m was then deposited at 900°C from a reactant mixture of 20 l/min hydrogen, 25 ml/min silane, 6 ml/min diborane and 250 ml/min oxygen.

Figure 5:
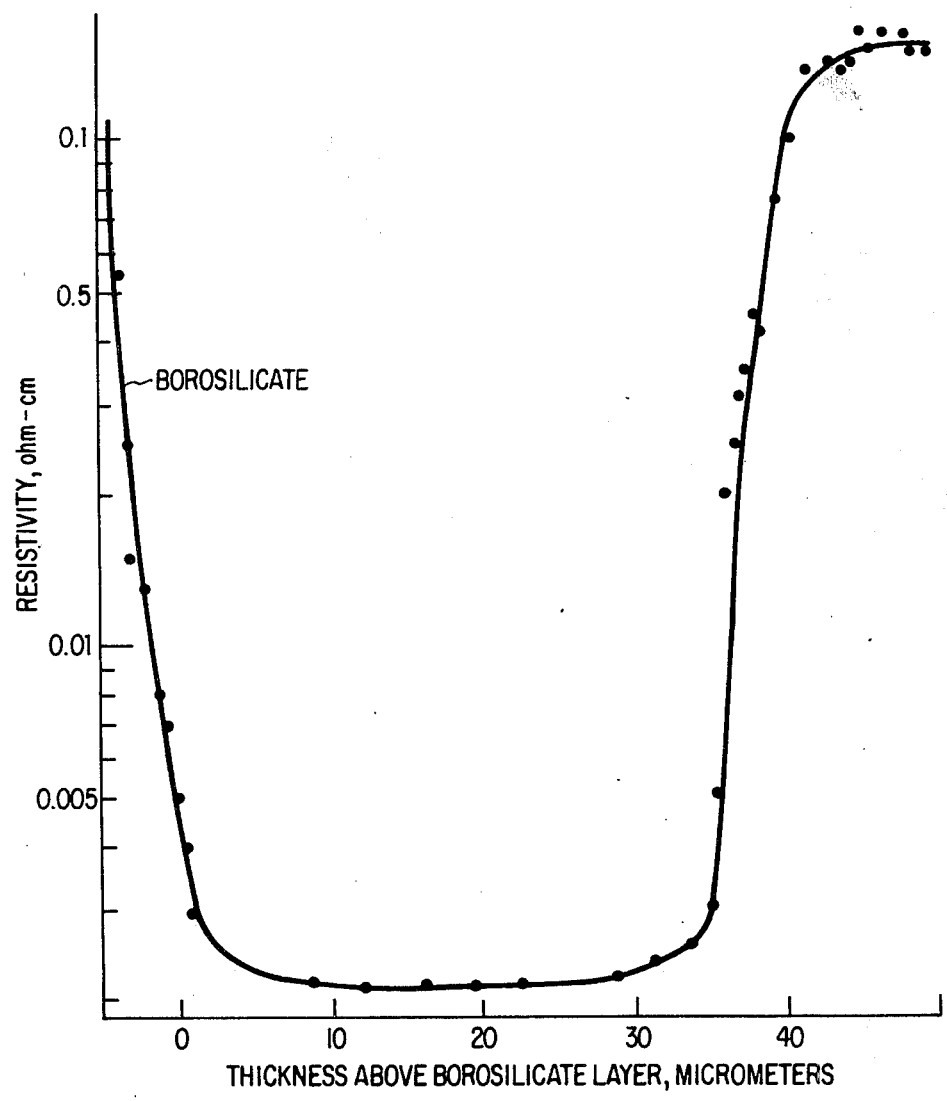
FIG. 5 is the resistivity profile of the p-region of a polycrystalline silicon junction device supported on a borosilicate coated steel substrate.

Several polycrystalline solar cells were then prepared by depositing silicon on steel substrates coated with 3 – 5 $\mu$m of borosilicate. The first silicon layer was p-type of 10 – 40 $\mu$m thickness and of a resistivity of 0.002 – 0.003 ohm-cm, while the second layer was of p-type silicon of 8 – 10 $\mu$m thickness having a resistivity of 0.2 – 2 ohm-cm. The final layer was a layer of n-type silicon of 0.2 – 0.4 $\mu$m thickness and 0.001 – 0.002 ohm-cm resistivity. The resistivity profile of a device having a first p-silicon layer of 35 $\mu$m thickness of 0.002 ohm-cm resistivity, a second p-silicon layer of 10 $\mu$m thickness of 0.2 ohm-cm resistivity and a final n-silicon layer of 0.002 $\mu$m thickness of 0.001 ohm-cm resistivity on a borosilicate/Vitrenamel I substrate is shown in FIG. 5.

EXAMPLE 3

Figure 6A:
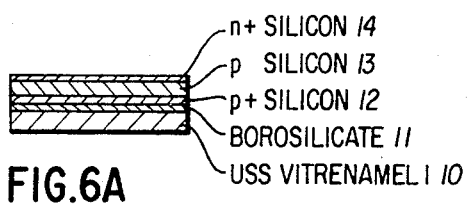
FIGS. 6 A-F show one embodiment of the configuration of polycrystalline silicon, p-n junction solar cell devices supported on a substrate of borosilicate coated steel.
Figure 6B:
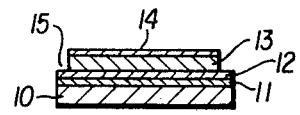
Figure 6C:
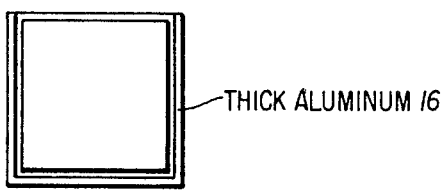
Figure 6E:
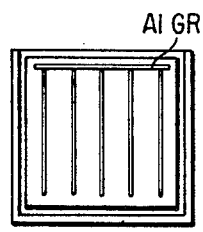
Figure 6D:
Figure 6F:
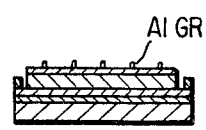

Several solar cells were fabricated from the steel/borosilicate structures described above as shown in FIG. 6A. Because borosilicate was used as the diffusion barrier, it was necessary to place the ohmic contacts in the n- and p-regions of the device on the front surface of the silicon. A 2 mm wide strip 15 of the upper n+– and p-silicon layers was removed from the periphery of the device as shown to expose the p+– layer 12, which is above the borosilicate layer 11 and steel substrate 10, but below p-type layer 13 and n-type layer 14 (FIG. 6B). A thick aluminum film 16, 1 mm wide was then deposited onto the exposed p+– layer, FIGS. 6C and 6D. The device was then annealed at 500°C for 20 min. to form a low-resistance ohmic contact. Thereafter, an aluminum grid contact 17 was evaporated through a metal mask onto the n+– layer, FIGS. 6E and 6F.

The electrical properties of the cells are exemplified by a particular cell having the following configuration: 0.2 $\mu$m thick – 0.001 ohm-cm n-silicon/5 $\mu$m thick - 3 ohm-cm p-silicon/15 $\mu$m thick – 0.003 ohm-cm p-silicon on borosilicate/Vitrenamel I. The p+– layer was deposited at 1000°C, and the other layers were deposited at 900°C. The average grain size was 2.5 $\mu$m. The p-n+junction was 4.4 cm$^2$ in area. The current-voltage characteristics were determined under illumination by a tungsten lamp. The power density of the surface of the device was estimated to be 80 m V/cm$^2$. The open-circuit voltage was about 0.1 V, and the conversion efficiency was about 0.05%.

EXAMPLE 4

A USS Vitrenamel I steel plate 1 mm thick was supported on a silicon carbide coated graphite susceptor in a 55 mm ID fused silicon reaction tube. An rf generator was used to heat the susceptor externally. A 3 $\mu$m thick borosilicate layer was deposited on the substrate by decomposing a mixture of hydrogen, silane, diborane and oxygen at flow rates of 20 l/min, 25 ml/min, 6 ml/min and 250 ml/min, respectively, at 900°C. Thereafter, a layer of silicon 55 $\mu$m thick was deposited over the borosilicate by decomposing a mixture of hydrogen and silane at flow rates of 20 ml/min and 50 ml/min, respectively, at 900°C. Both the silicon and borosilicate layers tightly adhered to the underlying substrates. Further, metallurgical examination of the cross-section of the deposited layers showed that no diffusion of iron occurred into the silicon, and similarly, no diffusion of silicon occurred into the steel substrate. The silicon layer overlying the borosilicate layer was of the n-type having an electrical resistivity of about 450 ohm-cm. The resistivity data indicated that borosilicate effectively functions as a diffusion barrier against the diffusion of iron from the steel substrate into silicon.

EXAMPLE 5

Following the procedure of Example 4, a borosilicate layer of 3 – 5 $\mu$m thickness was deposited over a Vitrenamel substrate. A 30 $\mu$m layer of silicon was subsequently deposited over the borosilicate layer by decomposing silane in hydrogen at 1150°C. Subsequent metallurgical examinations showed that the silicon/borosilicate/steel structures effectively prevented the diffusion of iron into the silicon layer at 1150°C.

EXAMPLE 6

A 7 $\mu$m thick film of silica was deposited on a steel substrate at 900°C by decomposing a mixture of hydrogen, silane and oxygen at flow rates of 20 l/min, 25 ml/min and 250 ml/min, respectively. Thereafter, the temperature of the substrate was increased to 1150°C, and about 30 $\mu$m of silicon was deposited. In Examples 5 and 6, metallurgical examinations showed that no iron diffused from the substrate into the silicon layer.

Having now fully described the invention, it will be apparent to one of ordinary skill in the art that many changes and modifications can be made thereto without departing from the spirit or scope of the invention as set forth herein.

What is claimed as new and intended to be secured by letters patent is:

1. A method of fabricating low-cost polycrystalline silicon solar cells supported on a steel substrate, which comprises: coating said steel substrate with a diffusion barrier selected from the group consisting of silica, borosilicate, phosphosilicate or mixtures thereof; and depositing successive layers of polycrystalline silicon containing appropriate dopants over said coated steel substrate such that p-n junction devices are formed which effectively convert solar energy to electrical energy.

2. The method of claim 1, wherein said supporting substrate is steel with a borosilicate diffusion barrier.

3. The method of claim 1, wherein said supporting substrate is steel with a silica diffusion barrier.

4. The method of claim 1, wherein said borosilicate coated steel is formed by decomposing a vaporous mixture of silane, hydrogen, diborane and oxygen over said steel.

5. The method of claim 1, wherein said silica coated steel is formed by decomposing a vaporous mixture of silane, hydrogen and oxygen over said steel.

* * * * *